United States Patent Office 3,748,131
Patented July 24, 1973

3,748,131

PHOTOSENSITIVE COMPOSITION AND ELEMENT COMPRISING LIGHT-SENSITIVE POLYMERS

George A. Reynolds, Thomas M. Laakso, Douglas G. Borden, and Jack L. R. Williams, Rochester, N.Y., assignors to Eastman Kodak Company, Rochester, N.Y.

No Drawing. Application Jan. 16, 1970, Ser. No. 3,536, which is a continuation-in-part of abandoned application Ser. No. 854,303, Aug. 29, 1969. Divided and this application Feb. 25, 1972, Ser. No. 229,543
Int. Cl. G03c *1/60, 1/70*
U.S. Cl. 96—35.1 17 Claims

ABSTRACT OF THE DISCLOSURE

Novel light-sensitive polymers contain as the light-sensitive moiety a side chain which contains two ethylenically unsaturated groups conjugated to each other through an arylene group. Photosensitive compositions and elements prepared with these polymers are useful in the preparation of photomechanical images such as photoresists and lithographic printing plates.

This is a division of application Ser. No. 3,536 filed Jan. 16, 1970, now Pat. No. 3,696,072, which is a continuation-in-part of our U.S. patent application Ser. No. 854,303, filed Aug. 29, 1969, and now abandoned.

It is an object of this invention to provide a novel class of light-sensitive polymers which can be efficiently sensitized to the visible region of the spectrum.

It is another object of this invention to provide a novel class of light-sensitive polymers which can be used in a variety of photographic and photothermographic reproduction processes.

It is a further object of this invention to provide photosensitive compositions and elements containing these novel light-sensitive polymers.

It is still a further object of this invention to provide processes for preparing photomechanical images employing these novel light-sensitive polymers.

The above and other objects of this invention will become apparent to those skilled in the art from the further description of the invention which follows.

We have found a novel class of light-sensitive polymers which contain side chains having two ethylenically unsaturated groups conjugated to each other through an arylene group. These polymers exhibit the inherent high sensitivity associated with polymers which contain two conjugated unsaturated groups in the polymer backbone, but they respond more readily to external sensitization and they can be prepared by processes which permit closer control over the physical properties of the resultant polymer. Thus, highly sensitized compositions and coatings can be prepared using polymers of this invention having a variety of physical properties.

In accordance with this invention there is provided a novel class of light-sensitive polymers which have attached to a polymer backbone as the light-sensitive moiety side chains containing two ethylenically unsaturated groups conjugated to each other through an arylene group. Typically, the light-sensitive moiety is attached to the polymer backbone through a carbonyl group. The light-sensitive polymers of this invention can be prepared by reacting a suitable compound containing the light-sensitive moiety with an appropriate polymer backbone. The compound containing the light-sensitive moiety should have one group which is reactive with a group on the polymer backbone and through which it can be attached to the polymer backbone. If the compound containing the light-sensitive moiety has more than one such group, the polymer backbone is likely to be crosslinked during the preparation thus destroying its utility in photo-sensitive compositions. Thus, one of the ethylenically unsaturated groups is attached to the polymer backbone through the residue of a group which is reactive with a group on the polymer backbone and the other of the ethylenically unsaturated groups is terminated with groups which are non-reactive with the groups on the polymer backbone. Typically, the light-sensitive polymers can be prepared by condensing a carboxylic acid or carboxylic acid halide containing the light-sensitive moiety with a preformed polymer containing groups reactive therewith, such as free reactive amino groups or hydroxyl groups, in which case the light-sensitive moiety is attached to the polymer backbone through an amido linkage or a carbonyloxy linkage. Another procedure for preparing light-sensitive polymers of this invention involves reacting a hydroxyl-containing derivative of the light-sensitive moiety with a polymer containing groups reactive therewith, such as free reactive anhydride groups, carboxylic acid groups or carboxylic acid halide groups, in which case the light-sensitive moiety is attached to the polymer backbone through an oxycarbonyl linkage.

Light-sensitive side chains which are appended to the polymer backbone to form the polymers of this invention can be represented by the formula:

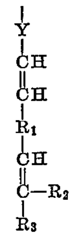

wherein Y is an oxycarbonyl linkage, a carbonyloxy linkage, an amido linkage, and the like; $R_1$ is an arylene group such as a mono- or polynuclear arylene group of the benzene series, e.g., phenylene, naphthylene, biphenylene, chlorophenylene, nitrophenylene, etc., or a 5- or 6-membered heterocyclic arylene group containing such hetero atoms as oxygen, sulfur, nitrogen, etc., pyridylene, furylene, thiofurylene, thienylene, 1-alkyl-2-pyrrolylene, etc., preferably $R_1$ is a phenylene group. $R_2$ and $R_3$ are so selected that they will not react with groups on the polymer backbone to which the light-sensitive moiety is attached. Thus, where the compound containing the light-sensitive moiety is bifunctional, such as a dicarboxylic acid, one of the functional groups is blocked so as to prevent crosslinking of the polymer backbone. Thus, $R_2$ is hydrogen, cyano, alkyl generally having 1 to 10 carbon atoms, e.g., methyl, ethyl, propyl, isopropyl, butyl, sec-butyl, t-butyl, n-amyl, neopentyl, n-hexyl, n-heptyl, n-octyl, 2-ethylhexyl, etc., alkenyl generally having 2 to 6 carbon atoms, e.g., vinyl, allyl, etc., and the like; and $R_3$ is hydrogen, nitro or a monovalent organic group non-reactive with the groups on the polymer backbone, such as alkyl generally having 1 to 10 carbon atoms, alkenyl generally having 2 to 6 carbon atoms, aryl, e.g., phenyl, naphthyl, biphenyl, furyl, pyridyl, etc., alkoxy generally having 1 to 10 carbon atoms, e.g., methoxy, ethoxy, propoxy, butoxy, amyloxy, hexyloxy, heptyloxy, etc., aryloxy, e.g., phenoxy, furyloxy, etc., alkylcarbonyl generally having 2 to 11 carbon atoms, e.g., methylcarbonyl, ethylcarbonyl, propylcarbonyl, butylcarbonyl, amylcarbonyl, hexylcarbonyl, octylcarbonyl, 2-ethylhexylcarbonyl, etc., arylcarbonyl, e.g., benzoyl, naphthoyl, etc., alkoxycarbonyl generally having 2 to 11 carbon atoms, e.g., methoxycarbonyl, ethoxycarbonyl, propoxycarbonyl, butoxycarbonyl, amyloxycarbonyl, hexylcarbonyl, heptyloxycarbonyl, octyloxycarbonyl, nonyloxycarbonyl, etc., alkenyloxycarbonyl generally having 3 to 7 carbon atoms, e.g., allyloxycarbonyl, methacryloylcarbonyl, etc., aryloxycarbonyl, e.g., phenoxycarbonyl, and the like, said aryloxycarbonyl, arylcarbonyl, aryloxy, and aryl groups being optionally substituted, particularly in the para-position, with such groups as nitro, azido, alkyl generally having 1 to 10 carbon atoms, alkoxy generally having 1 to 10 carbon atoms, dialkylamino, diarylamino and the like groups.

Representative reactants which can be employed to attach the light-sensitive side chain to the polymer include:

p-vinylcinnamoyl chlorides such as
- p-vinylcinnamoyl chloride,
- p-(2-nitrovinyl)cinnamoyl chloride,
- p-(2-propylvinyl)cinnamoyl chloride,
- p-(2-phenylvinyl)cinnamoyl chloride,
- p-[2-(p-nitrophenyl)vinyl]cinnamoyl chloride,
- p-(2,2-diethylvinyl)cinnamoyl chloride,
- p-(2-amyloxyvinyl)cinnamoyl chloride,
- p-(2-ethoxyvinyl)cinnamoyl chloride,
- p-[2-(2-ethylhexyloxy)vinyl]cinnamoyl chloride,
- p-(2-propoxy-2-cyanovinyl)cinnamoyl chloride,
- p-(2-naphthoxyvinyl)cinnamoyl chloride,
- p-(2-methylcarbonylvinyl)cinnamoyl chloride,
- p-(2-ethylcarbonylvinyl)cinnamoyl chloride,
- p-(2-ethyl-2-benzoylvinyl)cinnamoyl chloride,
- p-[2-butyl-2-(p-methoxybenzoyl)vinyl]cinnamoyl chloride,
- p-(2-ethoxycarbonylvinyl)cinnamoyl chloride,
- p-[2-(2-ethylhexyloxycarbonyl)vinyl]cinnamoyl chloride,
- p-(2-hexyloxycarbonylvinyl)cinnamoyl chloride,
- p-(2-ethyl-2-ethoxycarbonylvinyl)cinnamoyl chloride,
- p-(2-vinyl-2-ethoxycarbonylvinyl)cinnamoyl chloride,
- p-(2-allyl-2-propoxycarbonylvinyl)cinnamoyl chloride,
- p-(2-ethoxycarbonyl-2-cyanovinyl)cinnamoyl chloride,
- p-[2-(2-ethylhexyloxycarbonyl)-2-cyanovinyl] cinnamoyl chloride,
- p-(2-allyloxycarbonylvinyl)cinnamoyl chloride,
- p-(2-vinyl-2-allyloxycarbonylvinyl)cinnamoyl chloride,
- p-(2-phenoxycarbonylvinyl)cinnamoyl chloride, etc.; and 4-vinylchalcones such as
- 4-(2-chlorocarbonylvinyl)chalcone,
- 4-(2-chlorocarbonylvinyl)-4′-methoxychalcone,
- 4-(2-chlorocarbonylvinyl)-4′-amyloxychalcone,
- 4-(2-chlorocarbonylvinyl)-4′-(2-ethylhexyloxy) chalcone,
- 4-(2-chlorocarbonylvinyl)-4′-propylchalcone,
- 4-(2-chlorocarbonylvinyl)-4′-octylchalcone,
- 4-(2-chlorocarbonylvinyl)-4′-dimethylamino-chalcone,
- 4-(2-ethoxycarbonylvinyl)-4′-(2-hydroxyethoxy) chalcone, etc.;

as well as such reactants as
- 2-styryl-5-(2-chlorocarbonylvinyl)furan,
- 2-(2-amyloxyvinyl)-5-(2-chlorocarbonylvinyl)furan,
- 2-[2-(p-methoxyphenyl)vinyl]-5-(2-chlorocarbonyl-vinyl)furan,
- 2-[2-(2-ethylhexyl)vinyl]-5-(2-chlorocarbonyl-vinyl)thiofuran,
- 2-(2-ethoxycarbonylvinyl)-6-(2-chlorocarbonyl-vinyl)pyridine, and the like.

Typical polymers which form the backbone of the light-sensitive polymers and to which the light-sensitive moieties are appended include natural and synthetic resins such as hydroxyl containing polymers, for example, poly(vinyl alcohol), partially hydrolyzed poly(vinyl esters) such as poly(vinyl alcohol-co-vinyl acetate), poly(vinyl alcohol-co-vinyl benzoate), poly(vinyl alcohol-co-vinyl acetate-co-vinyl benzoate), partially hydrolyzed poly(vinyl acetals) such as partially hydrolyzed poly(vinyl butyral), partially hydrolyzed poly(vinyl benzal), partially hydrolyzed poly(vinyl cinnamal) as well as mixtures of such partially hydrolyzed acetals, polyethers such as epoxy and phenoxy polymers, e.g., the condensation product of a bisphenol, such as diphenylolpropane, with epichlorohydrin, naturally occurring materials such as cellulose, starch, guar alginic acid, and their partially esterified or etherified derivatives, e.g., ethyl cellulose, hydroxyethyl cellulose, hydroxypropyl cellulose, polyesters of polyhydroxy intermediates such as glycerol and sorbitol which have hydroxyl groups remaining after incorporation in the polymer chain, etc.; polymers containing reactive amino groups, for example, poly(vinyl amine), aminostyrenes, poly(vinyl anthranilates), etc., and polymers containing reactive anhydride groups, for example, copolymers of maleic anhydride with ethylene or styrene.

Light-sensitive polymers of this invention can be prepared by reaction of the hydroxy or amino group on the polymer backbone with an acyl halide of the light-sensitive moiety or by reaction of a hydroxy containing derivative of the light-sensitive moiety with a polymer containing reactive anhydride, carboxylic acid or carboxylic acid halide groups. This reaction is typically carried out in a tertiary amine solvent such as pyridine, picoline, lutidine, triethylamine, and the like, at room temperature, or at elevated temperatures up to about 100° C.

When the hydroxyl containing polymer employed is a poly(vinyl alcohol), light-sensitive polymers which have good solubility and other desirable physical properties can be prepared by the procedure described in copending Reynolds U.S. patent application Ser. No. 812,380, entitled "A Process for the Preparation of Soluble Polyvinyl Esters," filed Apr. 1, 1969, now Pat. No. 3,560,465. This procedure involves swelling the polyvinyl alcohol in a tertiary amine solvent followed by partial esterification with an aroyl chloride such as benzoyl chloride. The partially aroylated poly(vinyl alcohol) is then esterified with the photosensitive acid chloride, after which any remaining hydroxyl groups optionally can be esterified with aroyl chloride.

In addition to the groups containing the light-sensitive moiety of this invention, the polymers can have attached to the polymer backbone groups derived from other carboxylic acids. Such other groups are often used in modifying such physical properties of the polymer as solubility, adhesivity, melting point, ink receptivity, resistance to chemical etchants, and the like, and in some instances can modify the sensitometric properties of the polymer as well. Useful groups include those derived from aliphatic and aromatic carboxylic acid, such as acetic acid, haloacetic acid, propionic acid, butyric acid, isovaleric acid, succinic acid, glutaric acid, adipic acid, sebacic acid, 2-ethylhexanoic acid, decanoic acid, benzoic acid, halobenzoic acids, nitrobenzoic acids, toluic acids, p-ethylbenzoic acid, p-octylbenzoic acid, p-methoxybenzoic acid, p-ethoxybenzoic acid, p-amyloxybenzoic acid, p-lauryloxybenzoic acid, 2-naphthoic acid, and the like, as well as those derived from carboxylic acids which themselves give light-sensitive polymers, for example, acids containing the vinyl ketone group such as cinnamic acid, halocinnamic acids, cinnamylidene acetic acid, and the like. These modifying side chains can be introduced into the polymer by reacting it with an acyl halide of the modifying group, and it can be attached to the polymer prior to addition of the light-sensitive group, for example, when an acetylated poly(vinyl alcohol) is used as the polymer backbone, or when the procedure of the Reynolds' application, referred to above, is employed to prepare the light-sensitive polymers of this invention. Alternatively, free reactive groups, which are contained on the polymer backbone after addition of the light-sensitive moiety, can be reacted with an acyl halide, or other suitable reactant, of these modifying groups. The modifying side chains can comprise up to 95% of the groups attached to the polymer backbone. Thus, as few as 5% of the groups attached to the polymer backbone can be light-sensitive groups of the present invention. In general, it is preferred that 5 to 50% of the groups attached to the polymer backbone are light-sensitive groups of this invention, although this will vary depending upon the nature of the polymer forming the backbone, its molecular weight, and similar factors. Thus, for example, when a low molecular weight poly (vinyl alcohol) is employed as the polymer backbone preferably 20 to 100 mole percent of the groups attached to the polymer backbone are light-sensitive groups of this invention; when a medium molecular weight poly(vinyl alcohol) is employed 10 to 60 mole percent of the groups attached to the polymer backbone are preferably light-sensitive groups of this invention; and with a high molecular weight poly(vinyl alcohol) it is preferred that 5 to 50 mole percent of the groups attached to the polymer backbone be light-sensitive groups of this invention.

Coating compositions containing the light-sensitive polymers of this invention can be prepared by dispersing or dissolving the polymer in any suitable solvent or combination of solvents used in the art to prepare polymer dopes. Solvents that can be used to advantage include ketones such as 2-butanone, 4-methyl-2-pentanone, cyclohexanone, 4-butyrolactone, 2,4-pentandione, 2,5-hexandione, etc.; esters such as 2-ethoxyethyl acetate, 2-methoxyethyl acetate, n-butyl acetate, etc.; chlorinated solvents such as chloroform, dichloroethane, trichloroethane, tetrachloroethane, etc.; as well as dimethylformamide and dimethylsulfoxide; and mixtures of these solvents. Typically the light-sensitive polymer is employed in the coating composition in the range from about 1 to 20 percent by weight. Preferably the polymer comprises 2 to 10 percent by weight of the composition in a solvent such as listed above. The coating compositions also can include a variety of photographic addenda utilized for their known purpose, such as agents to modify the flexibility of the coating, agents to modify its surface characteristics, dyes and pigments to impart color to the coating, agents to modify the adhesivity of the coating to the support, antioxidants, preservatives, and a variety of other addenda known to those skilled in the art.

The coating compositions can be sensitized with such sensitizers as pyrylium and thiapyrylium dye salts, thiazoles, benzothiazolines, naphthothiazolines, quinolizones, acridones, cyanine dyes, dithiolium salts, Michler's ketone, Michler's thioketone, and the like sensitizers. When a sensitizer is employed, it can be present in amounts of about 0.1 to 10 percent by weight of the light-sensitive polymer, and it is preferably employed in the range of about 0.2 to 3 percent by weight of the light-sensitive polymer.

The light-sensitive polymer of this invention can be the sole polymeric constituent of the coating composition or another polymer can be incorporated therein to modify the physical properties of the composition and serve as a diluent. For example, phenolic resins, such as thermoplastic novolac resins or solvent-soluble resole resins can be incorporated in the composition to improve the resistance of the polymer composition to etchants when it is used as a photoresist. Similarly, hydrophilic polymers such as cellulose and its derivatives, poly(alkylene oxides), poly(vinyl alcohol) and its derivatives, and the like can be incorporated in the composition to improve the hydrophilic properties of the coating when it is used in the preparation of lithographic printing plates. These other polymeric materials can constitute up to 25% by weight of the polymeric components of the coating composition.

Photosensitive elements can be prepared by coating the photosensitive compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate, cellulose acetate butyrate, and the like. The optimum coating thickness for a particular purpose will depend upon such factors as the use to which the coating will be put, the particular light-sensitive polymer employed, and the nature of other components which may be present in the coating. Typical coating thicknesses can be from about 0.1 to 10 mils.

Photomechanical images can be prepared with photosensitive elements by imagewise exposing the element to a light source to harden or insolubilize the polymer in exposed areas. Suitable light sources which can be employed in exposing the elements include sources rich in visible radiation and sources rich in ultraviolet radiation, such as carbon are lamps, mercury, vapor lamps, fluorescent lamps, tungsten lamps, photoflood lamps, and the like.

The exposed element can be developed with a solvent for the unexposed, uncrosslinked polymer which is a nonsolvent for the exposed hardened polymer. Such solvents can be selected from the solvents listed above as suitable coating solvents as well as others.

In an alternate embodiment an image can be developed with the exposed elements by heating it to a temperature in the range of about 50 to 200° C., which is intermediate between the tackifying point of the polymer in unexposed and exposed areas, to soften or tackify the polymer in the unexposed areas. The softened polymer can then be toned or transferred to a receiving sheet under pressure and toned or transferred to a receiving sheet under pressure and toned, or transferred without toning if a pigment, dye or color-forming compound is incorporated in the layer.

The following examples further illustrate this invention.

EXAMPLE 1

Preparation of a poly[vinyl p-(2-benzoylvinyl)cinnamate

Method A.—A suspension of 1 g. of a medium molecular weight poly(vinyl alcohol) containing 12 percent acetate groups (Elvanol 52–22 sold by Du Pont) in 25 ml. of pyridine is heated overnight on a steam bath. After cooling to 30° C., 2.1 g. (0.007 mole) of 4-(2-chlorocarbonylvinyl)chalcone are added and the reaction mixture is stirred at 50° C. for two hours. At this time, 1.8 g. (0.013 mole) of benzoyl chloride are added and the reaction is continued for one hour at 50° C. The polymer is precipitated by pouring the reaction mixture as a fine stream into cold water, with stirring. After three rinses in portions of fresh water, it is filtered and vacuum dried over calcium chloride. A yield of 3.2 g. is obtained. The polymer has a sensitivity value of 17,000 and a spectral range of 260–425 mμ when evaluated by the procedure of L. M. Minsk et al. "Photosensitive Polymers, I & II" Journal of Applied Polymer Science; vol. II, No. 6, pp. 302–311 (1959). The sensitivity value is a measure of the relative speed of the polymer, when exposed to ultraviolet or visible light, compared with the speed of unsensitized poly(vinyl cinnamate) as a standard. The spectral range indicates the lower and upper limiting wavelengths in mμ which give effective crosslinking of polymer wedges prepared according to the referenced procedure. The coating and developing solvent is N,N-dimethylformamide. When sensitized with 2,6-bis(p-methoxyphenyl)-4-(p-n-amyloxyphenyl)thiapyrylium perchlorate, the polymer exhibits a sensitivity value of 53,700 and a spectral range of 260–570 mμ.

EXAMPLE 2

Preparation of a poly[vinyl p-(2-benzoylvinyl)cinnamate]

Method B.—This example demonstrates a procedure for preparing poly(vinyl esters) having good solubility which is particularly preferred when relatively high molecular weight acid chlorides are used. A suspension of 4.4 g. (0.10 mole) of a high molecular weight, completely hydrolyzed poly(vinyl alcohol) (Elvanol 72–60 sold by Du Pont) in 100 ml. of pyridine is swollen by heating overnight on a steam bath. After cooling to 30° C., 4 ml. (0.035 mole) of benzoyl chloride are added and the reaction mixture is stirred for one hour at 50° C. At this time, 7.4 g. (0.025 mole) of 4-(2-chlorocarbonylvinyl) chalcone are added and the reaction mixture is stirred at 50° C. for two more hours. Finally, 4.6 ml. (0.04 mole) of benzoyl chloride are added and the reaction mixture is stirred one more hour at 50° C. The polymer is precipitated in water, filtered, stirred with two more portions of fresh water, filtered again, and vacuum dried to yield 18 g. of polymer. The following sensitometric data for the polymer, measured by the procedure referenced in Example 1, show that certain sensitizers increase both speed and spectral response while others increase spectral response with a loss in speed.

| Sensitizer | Sensitivity value | Spectral range (mμ) |
|---|---|---|
| None | 27,000 | 260–435 |
| 2-benzoylemthylene-1-methyl-β-naphthothiazoline | 19,000 | 260–490 |
| Methyl 3-methyl-2-benzothiazolinylidenedithioacetate | 17,000 | 260–490 |
| 1,2-benzanthraquinone | 38,000 | 260–475 |
| Michler's ketone | 13,500 | 260–460 |
| 4H-quinolizine-4-one | 13,500 | 260–440 |
| 4H-quinolizine-4-thione | 7,600 | 280–490 |
| Eosin Y | 2,700 | 280–560 |
| N-phenylacridone | 24,000 | 260, 440 |
| N-phenylthioacridone | 4,250 | 290–505 |
| 2,6-bis(p-ethylphenyl)-4-(p-n-amyloxyphenyl)thiapyrylium perchlorate | 38,000 | 260–540 |
| 2,6-bis(p-ethoxyphenyl)-4-(p-n-amyloxyphenyl)-thiapyrylium perchlorate | 53,500 | 260–590 |
| 5,6-dihydro-2,4-diphenylnapththo-[1,2-b]pyrylium fluoborate | 38,000 | 260–440 |

EXAMPLE 3

Preparation of an epoxy p-(2-benzoylvinyl)cinnamate

A mixture of 5 g. (0.025 equiv.) of an epoxy resin of the epichlorohydrin-Bisphenol A type (EPON 1009, sold by Shell) having an equivalent weight of 200, and 5 g. (0.017 mole) of 4-(2-chlorocarbonylvinyl)chalcone in 50 g. of 1,2-dichloroethane is refluxed for 5 hours on a steam bath. The polymer is then precipitated by pouring the reaction mixture into ethanol. After washing in fresh ethanol, the polymer is filtered, rinsed on the filter with ethanol, and vacuum dried over calcium chloride. The yield is 9.5 g. Using 1,2-dichloroethane as the coating and developing solvent, the sensitivity value of the polymer is 35.5 and the spectral range is 370–410 mμ, unsensitized. When sensitized with 2,6-bis(p-ethoxyphenyl)-4-(p-n-amyloxyphenyl)thiapyrylium perchlorate, the sensitivity value is 25, and the spectral range is extended to 540 mμ.

EXAMPLE 4

Preparation of a cellulose p-(2-benzoylvinyl)cinnamate

A mixture of 4 g. of a medium molecular weight hydroxyethyl cellulose (Natrosol 250–J, sold by Hercules) and 3 g. of 4-(2-chlorocarbonylvinyl)chalcone in 75 ml. of pyridine is stirred at 50° C. for two hours. After 15 minutes, a clear solution results. After 2 hours, 5.7 g. (0.04 mole) of benzoyl chloride are added and the reaction mixture is stirred for 2 hours more at 50° C. The polymer is precipitated by pouring the reaction mixture into water. It is filtered, washed, and dried as in Example 1. The sensitometric data for this polymer (17 percent p-(2-benzoylvinyl)cinnamate, 83 percent benzoate) are as follows using dimethylformamide as the coating and developing solvent:

| Sensitizer | Sensitivity value | Spectral range (mμ) |
|---|---|---|
| None | 5,000 | 270–430 |
| Benzil | 6,300 | 270–440 |
| 2-Benzoylmethylene-1-methyl-β-naphthothiazoline | 6,300 | 270–440 |
| 2,6-bis(4-ethoxyphenyl)-4-(p-n-amyloxyphenyl)-thiapyrylium perchlorate | 25,000 | 270–580 |

EXAMPLE 5

Preparation of a poly{vinyl p-[2-(p-methoxybenzoyl)-vinyl]cinnamate}

One gram (0.02 mole) of a medium molecular weight poly(vinyl alcohol) (Elvanol 52–22 sold by Du Pont) is swelled in 35 ml. of pyridine by heating overnight. The mixture is then stirred and heated at 50° C. for 1 hour after adding 1.4 g. (0.01 mole, 1.15 ml.) of benzoyl chloride. Then 1.3 g. (0.04 mole) of 4-(2-chlorocarbonylvinyl)-4'-methoxychalcone are added and stirring and heating are continued another 6 hours. The mixture is allowed to stand at room temperature overnight, then the viscous dope is decanted from a small amount of solid. The dope is poured into 1 liter of water to precipitate the polymer. The liquid is decanted and the solid polymer is washed several times with cold water and dried at room temperature to yield 2.2 g. of polymer. The sensitometric data for this polymer, using cyclohexanone as the coating and developing solvent, are as follows:

| Sensitizer | Sensitivity value | Spectral range (mμ) |
|---|---|---|
| None | 3,800 | 270–420 |
| 2-benzoylmethylene-1-methyl-β-naphthothiazoline | 2,690 | 290–460 |
| 2,6-bis(p-ethoxyphenyl)-4-(p-n-amyloxyphenyl)-thiapyrylium perchlorate | 8,500 | 260–560 |

EXAMPLE 6

Preparation of a poly{vinyl p-[2-(p-amyloxybenzoyl)vinyl]cinnamate}

This polymer is prepared by the same procedure empolyed in Example 5 using 1 g. (0.02 mole of Elvanol 52–22, 25 ml. of pyridine, 1.13 g. (0.92 ml., 0.008 mole) of benzoyl chloride, and 1.9 g. (0005 mole) of 4-(2-chlorocarbonylvinyl)-4'-amyloxychalcone, to yield 2.7 g. of polymer. The unsensitized polymer has a sensitivity value of 1,800 and a spectral range of 280–425 mμ using cyclohexanone as the coating and developing solvent. When sensitized with 2,6-bis(p-ethoxyphenyl) - 4 - (p-n-amyloxyphenyl)thiapyrylium perchlorate the sensitivity value is 4,000 and the spectral range is 280–560 mμ.

EXAMPLE 7

Preparation of a poly[vinyl 3-(5-styrylfur-2-yl)acrylate]

A mixture of 1 g. (0.02 mole) of poly(vinyl alcohol) (Elvanol 52–22) and 25 ml. of pyridine is heated overnight on a steam bath. Benzoyl chloride (0.8 ml.) is added and the mixture stirred for 1 hour at 50° C. Then 1.8 g. of 5-(2-chlorocarbonylvinyl)-2-styrylfuran are added and stirring and heating at 50° C. continued for 3 hours. Finally, another 1 ml. of benzoyl chloride is added and heating at 50° C. and stirring is continued another 2 hours. The polymer is isolated as in Example 5 to yield 3.6 g. of polymer. The sensitometric data for this polymer, using 1,2-dichloroethane as the coating and developing solvent, are as follows:

| Sensitizer | Sensitivity value | Spectral range (mμ) |
|---|---|---|
| None | 2,500 | 260–460 |
| 2-benzoylmethylene-1-methyl-β-naphthothiazoline | 3,150 | 280–470 |
| 2,6-bis(p-ethoxyphenyl)-4-(p-n-amyloxyphenyl)-thiapyrylium perchlorate | 1,580 | 300–550 |

EXAMPLE 8

Preparation of a poly[vinyl p-(2-nitrovinyl)cinnamate]

A mixture of 2.1 g. (0.042 mole) of poly(vinyl alcohol) (Elvanol 52–22) and 70 ml. of pyridine is heated on a steam bath overnight. The mixture is cooled to 50° C., 1 ml. of benzoyl chloride is added, and heating at 50° C. and stirring are continued for 1 hour. Then 2.5 g. of p-(2-nitrovinyl)cinnamoyl chloride are added, and stirring and heating are continued for another 2 hours. Finally, another 3 ml. of benzoyl chloride are added and the mixture is stirred and heated at 50° C. for another hour. The polymer is isolated by the procedure described in Example 5.

Where bifunctional compounds containing the light-sensitive moiety are used to add the light-sensitive side chain to the polymer backbone, it is necessary to block one of the functional groups. The following Examples 9–20 show the blocking of one functional group, a carboxyl group, of a bifunctional reactant, a dicarboxylic acid, to give the half acid-half ester or half acid chloride-half ester, and the preparation of light-sensitive polymers therewith.

EXAMPLE 9

Preparation of di(2-ethylhexyl) p-phenylene-diacrylate

Two hundred and fifty grams (0.91 mole) of diethyl p-phenylenediacrylate are refluxed with 500 ml. of 2-ethyl-1-hexanol and 1 ml. of titanium isopropoxide under an azeotropic still head until the head temperature rises to 180° C. while gradually distilling the mixture of ethanol and 2-ethyl-1-hexanol. When most of the alcohols have been removed, the reaction mixture is cooled to room temperature where it solidifies. The remaining liquid is removed by filtration and the crystalline mass is recrystallized from petroleum ether, washed with cold petroleum ether, and dried over phosphorus pentoxide at reduced pressure. The yield of pure di(2-ethylhexyl) p-phenylenediacrylate, M.P. 62–64° C. is 356 g. or 88.5 percent of the theoretical value.

*Analysis.*—Calcd. for $C_{28}H_{42}O_6$ (percent): C, 76.0; H, 9.5. Found (percent): C, 75.8; H, 9.5.

EXAMPLE 10

Preparation of the mono-2-ethylhexyl ester of p-phenylenebis(acrylic acid)

Three hundred fifty-six grams (0.805 mole) of di(2-ethylhexyl) p-phenylenebisacrylate in 2500 ml. of dioxane are heated and stirred with 32.5 g. (0.81 mole) of sodium hydroxide in 75 ml. of water until the reaction mixture solidifies. Enough water is added to dissolve all the solids. This solution is made strongly acid with hydrochloric acid to precipitate the half acid-half ester. The crude product is washed well with water, dried, and recrystallized from benzene. The yield of white mono-2-ethylhexyl p-phenylenebis(acrylic acid) is 200 g. or 75.7 percent of theoretical (M.P. 170–172° C.)

*Analysis.*—Calcd. for $C_{20}H_{26}O_4$ (percent): C, 72.5; H, 7.9. Found (percent): C, 72.3; H, 8.1.

EXAMPLE 11

Preparation of p-[2,(2-ethylhexyloxycarbonyl)vinyl] cinnamoyl chloride

Thirty-seven grams (0.112 mole) of p-[2-(2-ethylhexyloxycarbonyl)vinyl]cinnamic acid are treated with 100 percent excess of thionyl chloride and refluxed for 2 hours. The excess thionyl chloride is removed by distillation and the residual oil is distilled at high vacuum (B.P. 158° C./5$\mu$, $N_D^{25}$=1.6205.) The yield is 36.5 g. or 93.7 percent of the theoretical value.

*Analysis.*—Calcd. for $C_{20}H_{25}O_3Cl$ (percent): C, 68.8; H, 7.2; Cl, 10.2. Found (percent): C, 68.4; H, 6.8; Cl, 10.0.

EXAMPLE 12

Preparation of a poly{vinyl p-[2-(2-ethylhexyloxycarbonyl)vinyl]cinnamate}

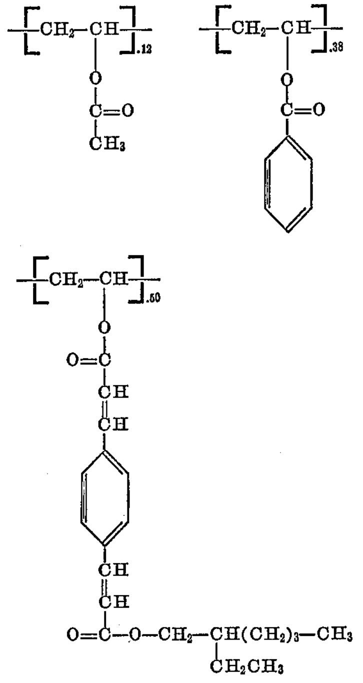

Two grams (0.0454 equiv.) of a poly(vinyl alcohol) having 12 percent residual acetate groups (Du Pont Elvanol 52–22) are heated in 100 ml. of dry pyridine at 80° C. for 8 hours. The swollen poly(vinyl alcohol) is cooled to room temperature and treated with 2 ml. (3.2 g., 0.0227 mole) of benzoyl chloride. This mixture is heated at 50° C. for 2.5 hours after which 8.0 g. (0.0228 mole) of p-[2-(2-ethylhexyloxycarbonyl)vinyl] cinnamoyl chloride is added. Heating and stirring are continued for an additional 4 hours. The polymer is isolated by slowly pouring the reaction mixture into 98 percent methanol. After leaching in 98 percent methanol and then in anhydrous methanol, the polymer is dried at reduced pressure over phosphoric anhydride. The yield of light-sensitive polymer is 10.5 g. or 92 percent of the theoretical value.

*Analysis.*—Calcd. for $C_{15.5}H_{18}O_3$ (percent): C, 73.8; H, 7.1. Found (percent): C, 74.4; H, 7.2.

The sensitometric data for this polymer using dichloroethane as the coating and developing solvent are as follows:

| Sensitizer | Sensitivity value | Spectral range (m$\mu$) |
|---|---|---|
| None | 2,000 | 270–380 |
| 2,6-bis(4-ethoxyphenyl)-4-(4-n-amyloxyphenyl)-thiapyrylium perchlorate | 8,000 | 270–520 |
| 2-benzoylmethylene-1-methyl-$\beta$-naphthothiazoline | 20,000 | 270–400 |
| 4-H-quinolizine-4-thione | 2,800 | 270–480 |

EXAMPLE 13

Preparation of an epoxy p-[2-(2-ethylhexyloxycarbonyl)-vinyl]cinnamate

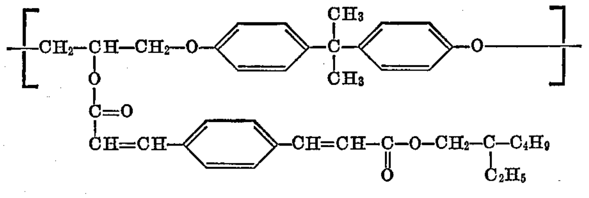

Twenty-five grams (0.088 equivalents) of a polyether prepared by condensation of 2,2-bis(p-hydroxyphenyl)

propane with epichlorohydrin (sold by Union Carbide, Phenoxy PRDA Resin) are dissolved in 800 ml. of a 50:50 pyridine:dichloroethane mixture. To this solution are added 31 g. (0.089 equivalents) of p-[2-(2-ethylhexyloxycarbonyl)vinyl]cinnamoyl chloride and the mixture is heated at 50° C. in total darkness with occasional shaking for 4 hours. The cooled solution is then slowly poured into 4 liters of a 98 percent methanol solution. The polymer is leached in 98 percent methanol and then in anhydrous methanol, and finally is dried over phosphoric anhydride at reduced pressure. All of the above isolation steps are done in the absence of white light. The yield of a light-sensitive poly{{2-{p-[2-(2-ethylhexyloxycarbonyl)-vinyl]cinnamoyloxy}trimethylene - 2,2 - bis (4-oxyphenyl)propane}} is 45 g. or 86.5 percent of the theoretical value.

*Analysis.*—Calcd. for $C_{38}H_{44}O_6$ (percent): C, 76.5; H, 7.3. Found (percent): C, 76.7; H, 7.3.

The sensitometric data for this polymer using dichloroethane as the coating and developing solvent are as follows:

| Sensitizer | Sensitivity value | Spectral range (mμ) |
|---|---|---|
| None | 1,100 | 280–365 |
| 2,6-bis(4-ethoxyphenyl)-4-(4-n-amyloxyphenyl)-thiapyrylium perchlorate | 2,300 | 280–360 |
| 2-benzoylmethylene-1-methyl-β-naphthothiazoline | 4,800 | 280–430 |

EXAMPLE 14

Preparation of monoethyl ester of p-phenylenebis(acrylic acid)

This preparation is carried out as in Example 10 in ethanol instead of in dioxane and using diethyl p-phenylenediacrylate rather than the di(2-ethylhexyl) ester, otherwise, the procedure is exactly the same. The product is crystallized from benzene (M.P. 214–215° C., 91.9 percent yield).

*Analysis.*—Calcd. for $C_{14}H_{14}O_4$: C, 68.2; H, 5.8. Found (percent): C, 68.5; H, 5.7.

EXAMPLE 15

Preparation of a p-(2-ethoxycarbonylvinyl) cinnamoyl chloride

This preparation is carried out as in Example 11, using the monoethyl ester of p-phenylenebis(acrylic acid). The product distills at 160° C./10μ (M.P. 125–126° C., yield 80.5 percent).

*Analysis.*—Calcd. for $C_{14}H_{13}O_3Cl$ (percent): C, 63.5; H, 4.9; Cl, 13.4. Found (percent): C, 63.5; H, 4.9; Cl, 13.6.

EXAMPLE 16

Preparation of an epoxy p-(2-ethoxycarbonylvinyl)-cinnamate

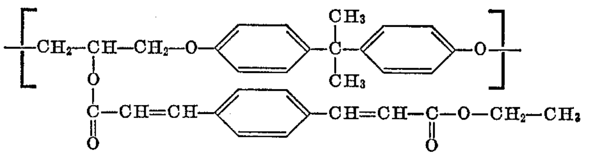

Thirty-four and eight hundredths grams (0.12 equiv.) of a polyether prepared by polycondensation of 2,2-bis(p-hydroxyphenyl)propane with epichlorohydrin (sold by Union Carbide Co. as "Phenoxy" PRDA) are dissolved in 900 ml. of a 11:10 mixture of dichloroethane and pyridine by shaking under anhydrous conditions. To this solution are added 31.68 g. (0.12 mole) of p-(2-ethoxycarbonylvinyl)cinnamoyl chloride in 300 ml. of dry pyridine. The above mixture is heated at 55° C. in total darkness with occasional shaking for 6 hours. The solution is then slowly poured into 4 liters of a 98 percent methanol solution to precipitate the polymer. The polymer is first leached in 98 percent methanol and then in anhydrous methanol, and finally is dried over phosphoric anhydride at reduced pressure. All of the above isolation steps are done in the absence of light. The yield of light-sensitive polymer is 57 g. or 93 percent of the theoretical value.

*Analysis.*—Calcd. for $C_{32}H_{32}O_6$ (percent): C, 75.0; H, 6.2. Found (percent): C, 74.5; H, 6.2.

The sensitometric data for this polymer using dichloroethane as the coating and developing solvent are as follows:

| Sensitizer | Sensitivity value | Spectral range (mμ) |
|---|---|---|
| None | 1,300 | 270–385 |
| 2,6-bis(4-ethoxyphenyl)-4-(4-n-amyloxyphenyl)-thiapyrylium perchlorate | 8,000 | 270–560 |
| 2-benzoylmethylene-1-methyl-β-naphthothiazoline | 8,000 | 270–460 |
| 4-H-quinolizine-4-thione | 8,000 | 270–485 |

The following Examples 17 to 20 describe the preparation of polymers of this invention similar to those shown in Example 16, but having terminal unsaturated groups on the light-sensitive side chain.

EXAMPLE 17

Preparation of diallyl p-phenylenediacrylate

Two hundred and seventy-four grams (1 mole) of diethyl p-phenylenediacrylate are refluxed with 1250 ml. of allyl alcohol and 5 ml. of titanium isopropoxide under an azeotropic still head until the head temperature rises to 97° C. while slowly distilling the mixture of ethanol and excess allyl alcohol. When most of the alcohols have been removed, the mixture is cooled to room temperature, at which point the product crystallizes. The crystals are filtered and recrystallized from hexane, washed with cold hexane and air dried. The yield is 250.8 g. or 83.8 percent of theoretical (M.P. 60–62° C.)

*Analysis.*—Calcd. for $C_{18}H_{18}O_4$ (percent): C, 72.4; H, 6.0. Found (percent): C, 72.3; H, 6.4.

EXAMPLE 18

Preparation of the mono-allyl ester of p-phenylenebis-(acrylic acid)

A mixture of 258.8 g. (0.84 mole) of the diallyl ester prepared in Example 17 in 1 liter of allyl alcohol and 33.3 g. of sodium hydroxide in 100 ml. of water is heated and stirred at 50° C. until the reaction mixture solidifies. Enough water is added to dissolve all the solids and the solution is made strongly acid with hydrochloric acid to precipitate the half acid-half ester. The crude product (218 g.) is collected, washed well with water, dried and recrystallized from benzene to yield 169 g. or 65.5 percent of theoretical (M.P. 209–210° C.).

*Analysis* .—Calcd. for $C_{15}H_{14}O_6$ (percent): C, 69.8; H, 5.4. Found (percent): C, 70.1; H, 5.6.

EXAMPLE 19

Preparation of p-(2-allyloxycarbonylvinyl)-cinnamic acid chloride

One hundred and twenty grams (0.466 mole) of the 4-(2-allyloxycarbonylvinyl)cinnamic acid prepared in Example 18 is treated with 63 g. (0.5 mole) of oxalyl chloride and 1 drop of N,N-dimethylformamide, then heated at reflux for 2 hours. Two hundred and fifty milliliters of benzene are added and refluxing continued an additional 30 minutes. The excess solvents are removed by distillation and another 250 ml. of dry benzene are added. Again the solvent is removed by distillation and then the product is distilled (B.P. 155° C./3μ, M.P. 88–90° C.) The yield is 99 g. or 78 percent of theoretical.

*Analysis.*—Calcd. for $C_{15}H_{13}ClO_3$ (percent): C, 65.3; H, 4.7; Cl, 12.7. Found (percent): C, 65.5; H, 5.0; Cl, 13.1.

EXAMPLE 20

Preparation of an epoxy p-(2-allyloxycarbonylvinyl)-cinnamate

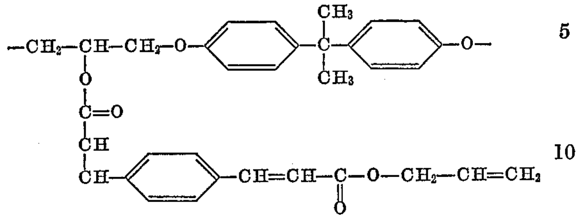

Six grams of a polyether prepared by polycondensation of 2,2-bis(p-hydroxyphenyl)propane with epichlorohydrin having an intrinsic viscosity of 0.87 (sold by Shell Chemical Co. as Epon 55B–40 Resin) is dissolved in 200 ml. of a 1:1 mixture of dry pyridine and dry 1,2-dichloroethane. At 70° C. this mixture is treated with 6.9 g. of the acid chloride prepared in Example 19 with stirring under essentially anhydrous conditions. After 4 hours of heating and stirring the mixture is cooled and diluted with an equal volume of 1,2-dichloroethane and filtered. The polymer is isolated by pouring the filtrate very slowly into 4 volumes of 95 percent methanol stirred in a blender after leaching in fresh methanol the polymer is air dried. The yield is 10 grams. The sensitometric data for this polymer is as follows:

| Sensitizer | Sensitivity value | Spectral range (mμ) |
|---|---|---|
| None | 1,500 | 280–390 |
| 2-benzoylmethylene-1-methyl-β-naphthothiazoline | 5,500 | 280–480 |
| 2,6-bis(p-ethoxyphenyl)-4-(p-n-amyloxyphenyl)-thiapyrylium perchlorate | 7,000 | 280–580 |

EXAMPLE 21

Preparation of a poly[vinyl p-(2-ethoxycarbonyl-2-cyanovinyl)cinnamate]

This polymer is prepared by the procedure described in Example 5 using 1 g. (0.02 mole) of Elvanol 52–22, 25 ml. of pyridine, 1.2 ml. of benzoyl chloride, and 1.16 g. (0.04 mole) of p-(2-ethoxycarbonyl-2-cyanovinyl) cinnamoyl chloride to yield 2.2 g. of polymer. The unsensitized polymer has a sensitivity value of 1,000 and a spectral range of 290–405 mμ using cyclohexanone as the coating and developing solvent. When sensitized with 2,6-bis(p-ethoxyphenyl) - 4 - (p - n - amyloxyphenyl)thiapyrylium perchlorate the sensitivity value is 2,200 and the spectral range is 290–565 mμ.

EXAMPLE 22

Preparation of a poly{vinyl p-[2-(2-ethylhexyloxycarbonyl)-2-cyanovinyl]cinnamate}

This polymer is prepared by the procedure described in Example 5 using 1 g. (0.02 mole) of Elvanol 52–22, 25 ml. of pyridine, 1.2 ml. of benzoyl chloride, and 1.9 g. p-[2,(2-ethylhexyloxycarbonyl) - 2-cyanovinyl]cinnamoyl chloride, to yield 3.2 g., of polymer. The unsensitized polymer has a sensitivity value of 500 and a spectral range of 290–400 mμ using a 50:50 mixture of cyclohexanone and methyl ethyl ketone as the coating and developing solvent. When sensitized with 2,6-bis(p-ethoxyphenyl)-4-(p-n-amyloxyphenyl)-thiapyrylium perchlorate the sensitivity value is 1,780 and the spectral range is 290–550 mμ.

EXAMPLE 23

Preparation of light-sensitive polymer from styrene-maleic anhydride copolymer

Four grams (0.02 mole) of a high molecular weight styrene-maleic anhydride copolymer having a molar ratio of styrene to maleic anhydride of approximately 1:1 (Lustrex 810 sold by Monsanto Chemical Co.) and 100 ml. of pyridine are heated on a steam bath for one hour.

After cooling to room temperature, 3.8 g. (0.01 mole) of 4′-(β-hydroxyethoxy)-4-(2-ethoxycarbonylvinyl)chalcone are added and the mixture heated and stirred at 50° C. for 4 hours. The mixture is poured into dilute hydrochloric acid solution to precipitate the polymer. The aqueous phase is removed and the solid washed 3 times each in 3 liters of cold water to yield 5.5 g. of polymer.

EXAMPLE 24

Preparation of a poly{vinyl p-[2-(2-ethylhexyloxycarbonyl)vinyl]cinnamate-co-vinyl butyral}

Thirty grams of a thoroughly dry, partially hydrolyzed poly(vinyl butyral) (Butvar 72–A sold by Shawinigan Resins Corporation, Springfield, Mass., which has an average molecular weight of between 180,000 and 270,000 and a hydroxyl content, expressed in weight percent of poly(vinyl alcohol) of 17.5 to 21.0 weight percent) is dissolved in 400 ml. of a 1:1 by volume mixture of dry pyridine and 1,2-dichloroethane. Under essentially anhydrous conditions 43 g. of p-[2-(2-ethylhexyloxycarbonyl)vinyl]cinnamoyl chloride is gradually added over a period of 5 minutes. The mixture is heated at 70° C. with stirring for 4 hours, cooled to room temperature, diluted with an equal volume of 1,2-dichloroethane and filtered. The polymer is precipitated from solution by pouring the filtrate into 6 volumes of 95 percent methanol. The solid polymer is collected by filtration, cut into very thin strips, and leached successively with methanol, water, and methanol. The solid is collected by filtration, and dried over phosphoric anhyride at reduced pressure to yield 66.5 g. of a thermoplastic polymer. The sensitometric data for this polymer using 1,2-dichloroethane as the coating and developing solvent are as follows:

| Sensitizer | Sensitivity value | Spectral range (mμ) |
|---|---|---|
| None | 1,000 | 280–380 |
| 2-benzoylmethylene-1-methyl-Z-naphthothiazoline | 7,000 | 280–480 |
| 2,6-bis(4-ethoxyphenyl)-4-(4-n-amyloxyphenyl)-thiapyrylium per chlorate | 15,000 | 280–580 |
| 4H-quinolizine-4-thione | 5,000 | 280–500 |

EXAMPLE 25

Preparation of copoly{styrene-4-[p-(p-benzoylvinyl)-cinnamido]styrene-4-benzamidostyrene}

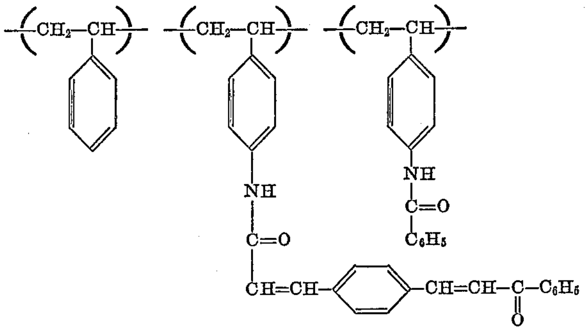

To 7.3 g. (0.03 mole) of a 45 percent dope of copoly-(styrene-4-aminostyrene) (mole ratio 1.7:1) in dioxane is added 75 ml. of dry pyridine and 3.6 g. (0.012 mole) of 4-(2-chlorocarbonylvinyl)chalcone. The mixture is stirred and heated at 50° C. for 2 hours at which time complete solution results. To the mixture is then added 2.2 ml. of benzoyl chloride and stirring and heating are continued another 2 hours. A solid begins to precipitate shortly after the benzoyl chloride is added. The reaction mixture is poured into 3 liters of water and the solid is collected and soaked overnight in fresh water. The solid is collected, washed with water, and dried in a desiccator over calcium chloride to yield 7 g. of polymer having a sensitivity value of 22 and spectral range of 280 to 380.

EXAMPLE 26

Preparation of lithographic plates from a poly[vinyl-p-(2-benzoylvinyl)cinnamate]

A 4 percent solution of poly[vinyl benzoate-vinyl p-(2-benzoylvinyl)cinnamate], prepared as described in Example 2 having 25 percent p-(2-benzoylvinyl)cinnamate groups, is prepared in a 3:1 mixture of 2-butanone and cyclohexanone, and is whirl-coated on a grained aluminum plate and also on a coarse-grained zinc plate. After being exposed for 2 seconds to a General Electric RS Sunlamp at 10 inches through a line and half-tone negative transparency, the plates are swab-developed with cyclohexanone and 2-butanone, then with a desensitizing etch, and finally with a greasy lithographic ink. Excellent positive lithographic plates are obtained. A 3 percent solution of a similar vinyl p-(2-benzoylvinyl)cinnamate polymer is coated from a 3:2 mixture of dimethylformamide and 1,2-dichloroethane on subbed and unsubbed grained aluminum plates. These plates are then exposed through half-tone and line negative transparencies on a commercial platemaker (Nu-Arc Flip-Top Platemaker sold by the Nu-Arc Co., Chicago, Ill.) having a xenon source at approximately 20 inches from the plates. An exposure of 10 units is given the plates and then they are swab-developed with 4-butyrolactone, a desensitizing etch, and a greasy lithographic ink to give excellent positive lithographic plates.

EXAMPLE 27

Preparation of a photoresist material from a poly[vinyl p-(2-benzoylvinyl)cinnamate]

A medium molecular weight partially hydrolyzed poly(vinyl acetate) is esterified by the procedure of Example 2 to give a light-sensitive polymer containing 12 percent acetate, 68 percent p-lauryloxybenzoate, and 20 percent p-(2-benzoylvinyl)-cinnamate groups. This polymer has a sensitivity value of 5000 and a spectral range of 280–425 m$\mu$. A 4 percent by weight solution of this polymer plus 0.1 percent of 2,6-bis(p-ethoxyphenyl)-4-(p-n-amyloxyphenyl)thiapyrylium perchlorate in chlorobenzene is whirl-coated on a plate of 20-mil gravure copper which previously has been treated with 5 percent hydrochloric acid, water, and air-dried. The coated plate is dried at 50° C for 10 mintues in a circulating air oven. It is then exposed through a line and half-tone negative transparency at a setting of 15 units on the platemaker used in Example 26 (Nu-Arc Flip-Top Platemaker.) The plate is developed in trichloroethane and rinsed with acetone. After masking the back of the plate with tape, it is etched for 10 minutes in 42° Baumé ferric chloride at room temperature. After rinsing with dilute acid and water, the plate is dried. This plate clearly shows the excellent resist properties of the poly-[vinyl p-(2 - benzoylvinyl)cinnamate] to ferric chloride etching.

EXAMPLE 28

Preparation of lithographic and photoresist elements (1) A solution of 5 percent of the polymer prepared in Example 12 in 1,2-dichloroethane is whirl-coated on an anodized, grained, and subbed aluminum plate. A similar coating (2) is made with the addition of 0.1 percent of the 2,6-bis(4-ethoxyphenyl)-4-(4 - n - amyloxyphenyl) thiapyrylium perchlorate. Coating (1) is exposed at 40 units and coating (2) at 30 units on the platemaker used in Example 26. The plates are swab developed in 4-butyrolactone, water, and a desensitizing etch, and then are rubbed up with a greasy lithographic ink to produce excellent negative-working lithographic printing plates. (3) A 10 percent solution of the polymer prepared in Example 12 in chlorobenzene plus 0.1 percent of 2,6-bis-(4-ethoxyphenyl)-4-(4 - n - amyloxyphenyl)thiapyrylium perchlorate is whirl-coated on a 1.5 mil copper-clad circuit board and prebaked at 43° C. for 15 minutes. It is then exposed imagewise for 15 units on a 3M 107 Copier, developed in a vapor degreaser with hot trichloroethylene, postbaked for 5 minutes at 120° C., and spray etched for 3 minutes in 42° Baumé ferric chloride at 130° F. An excellent resist image is formed which is suitable for printed circuit applications.

This invention has been described in detail with particular reference to preferred embodiments thereof, but it will be understood that variations and modifications can be effected within the spirit and scope of the invention.

What is claimed is:

1. A photosensitive element which comprises a support bearing a layer of a light-sensitive, linear, film-forming polymer having attached to a polymer backbone side chains containing two ethylenically unsaturated groups conjugated to each other through an arylene group.

2. A photosensitive element as defined in claim 1, wherein the light-sensitive polymer comprises a polymer backbone derived from a polymer containing free reactive amino or hydroxyl groups to which is attached light-sensitive side chains having the structural formula:

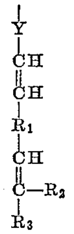

wherein Y is selected from the group consisting of carbonyloxy, oxycarbonyl and amido linkages, $R_1$ is an arylene group, $R_2$ is selected from the group consisting of hydrogen, cyano and alkyl groups and $R_3$ is selected from the group consisting of hydrogen, nitro and monovalent organic groups which are non-reactive with groups on the polymer backbone.

3. A photosensitive element as defined in claim 2 wherein Y is a carbonyloxy group, $R_1$ is a phenylene group, $R_2$ is hydrogen, and $R_3$ is selected from the group consisting of alkoxycarbonyl groups, alkenyloxycarbonyl groups and arylcarbonyl groups.

4. A photosensitive element as defined in claim 3 wherein the polymer backbone is derived from a hydroxyl-containing polymer selected from the group consisting of polyvinyl alcohol and the polyether condensation product of a bisphenol with epichlorohydrin.

5. A photosensitive element as defined in claim 4, wherein the light-sensitive polymer further comprises, attached to the polymer backbone, sidechains derived from a modifying carboxylic acid selected from the group consisting of acetic acid and benzoic acid.

6. A process for preparing a photomechanical image which comprises the steps of (1) imagewise exposing to actinic radiation a photosensitive element which comprises a support bearing a layer of a light-sensitive, linear, film-forming polymer having attached to a polymer backbone side chains containing two ethylenically unsaturated groups conjugated to each other through an arylene group, and (2) developing an image by removing polymer from unexposed areas of the layer.

7. A photosensitive element as defined in claim 1 wherein one of the ethylenically unsaturated groups in the side chain is attached to the polymer backbone through the residue of a group reactive with groups on the polymer backbone and the other ethylenically unsaturated group is terminated with groups which are non-reactive with groups on the polymer backbone.

8. A photosensitive element as defined in claim 7 wherein the polymer backbone is derived from a polymer selected from the group consisting of polymers containing free reactive amino groups and polymers containing free hydroxyl groups.

9. A photosensitive element as defined in claim 8 wherein the side chains are derived from a reactant selected from the group consisting of p-vinylcinnamoyl chlorides and 4-(2-chlorocarbonylvinyl)chalcones.

10. A photosensitive element comprising a support bearing a layer of a poly vinyl{p-[2 - (2 - ethylhexyloxycarbonyl)-vinyl]cinnamate}.

11. A photosensitive element comprising a support bearing a layer of a poly{{2 - {p-[2 - (2 - ethylhexyloxycarbonyl)-vinyl]cinnamoyloxy}trimethylene - 2,2 - bis(4-oxyphenyl)propane}}.

12. A photosensitive composition comprising a solution in an organic solvent of a light-sensitive, linear, film-forming polymer having attached to a polymer backbone side chains containing two ethylenically unsaturated groups conjugated to each other through an arylene group.

13. A photosensitive composition as defined in claim 12 wherein one of the ethylenically unsaturated groups in the side chain is attached to the polymer backbone through the residue of a group reactive with groups on the polymer backbone and the other ethylenically unsaturated group is terminated with groups which are non-reactive with groups on the polymer backbone.

14. A photosensitive composition as defined in claim 13 wherein the polymer backbone is derived from a polymer selected from the group consisting of polymers containing free reactive amino groups and polymers containing free hydroxyl groups.

15. A photosensitive composition as defined in claim 14 wherein the side chains are derived from a reactant selected from the group consisting of p-vinylcinnamoyl chlorides and 4-(2-chlorocarbonylvinyl)chalcones.

16. A photosensitive composition as defined in claim 12 wherein the light-sensitive polymer comprises a polymer backbone derived from a polymer containing free reactive amino or hydroxyl groups to which is attached light-sensitive side chains having the structural formula:

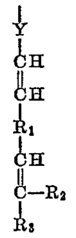

wherein Y is selected from the group consisting of carbonyloxy, oxycarbonyl and amido linkages, $R_1$ is an arylene group, $R_2$ is selected from the group consisting of hydrogen, cyano and alkyl groups and $R_3$ is selected from the group consisting of hydrogen, nitro and monovalent organic groups which are non-reactive with groups on the polymer backbone.

17. A photosensitive composition as defined in claim 16 wherein the polymer backbone is derived from a hydroxyl-containing polymer selected from the group consisting of polyvinyl alcohol and the polyether condensation product of a bisphenol with epichlorohydrin, Y is a carbonyloxy group, $R_1$ is a phenylene group, $R_2$ is hydrogen, and $R_3$ is selected from the group consisting of arylcarbonyl groups, alkenyloxycarbonyl groups and arylcarbonyl groups.

References Cited

UNITED STATES PATENTS

| | | | |
|---|---|---|---|
| 3,295,974 | 1/1967 | Erdmann ---------- | 96—115 R |
| 2,824,084 | 2/1958 | Unruh et al. ------- | 96—115 R |

RONALD H. SMITH, Primary Examiner

U.S. Cl.X.R.

96—115 R; 204—159.14